United States Patent
Kojima et al.

(10) Patent No.: US 10,825,927 B2
(45) Date of Patent: Nov. 3, 2020

(54) LDMOS DEVICE HAVING HOT CARRIER SUPPRESSION

(71) Applicant: ABLIC Inc., Chiba (JP)

(72) Inventors: Ryuhei Kojima, Chiba (JP); Keisuke Nagao, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/184,015

(22) Filed: Nov. 8, 2018

(65) Prior Publication Data

US 2019/0148543 A1 May 16, 2019

(30) Foreign Application Priority Data

Nov. 10, 2017 (JP) .................................. 2017-217346

(51) Int. Cl.
| | | |
|---|---|---|
| H01L 29/78 | (2006.01) | |
| H01L 29/417 | (2006.01) | |
| H01L 29/423 | (2006.01) | |
| H01L 29/08 | (2006.01) | |
| H01L 29/06 | (2006.01) | |
| H01L 29/66 | (2006.01) | |
| H01L 29/10 | (2006.01) | |

(52) U.S. Cl.
CPC ........ *H01L 29/7816* (2013.01); *H01L 29/063* (2013.01); *H01L 29/0634* (2013.01); *H01L 29/0653* (2013.01); *H01L 29/0865* (2013.01); *H01L 29/0878* (2013.01); *H01L 29/0882* (2013.01); *H01L 29/1083* (2013.01); *H01L 29/41758* (2013.01); *H01L 29/42356* (2013.01); *H01L 29/66681* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0251492 A1* | 12/2004 | Lin | ................... | H01L 29/66689 257/335 |
| 2011/0220995 A1* | 9/2011 | Chou | ................ | H01L 29/66659 257/335 |
| 2015/0069509 A1* | 3/2015 | Lee | ..................... | H01L 29/7835 257/343 |
| 2015/0364598 A1* | 12/2015 | Jung | .................... | H01L 29/0653 257/343 |
| 2019/0058039 A1* | 2/2019 | Cai | ..................... | H01L 29/0869 |

FOREIGN PATENT DOCUMENTS

JP          2014-107302 A      6/2014

* cited by examiner

*Primary Examiner* — Nduka E Ojeh
(74) *Attorney, Agent, or Firm* — Brinks Gilson & Lione (57) ABSTRACT

A first diffusion region of a first conductivity type and a second diffusion region of a second conductivity type are formed next to each other in a semiconductor substrate. Drain and source contact regions of the first conductivity type are formed in the first and second diffusion region, respectively. A trench insulating region is formed in the first diffusion region between the drain and source contact regions. A third diffusion region of the second conductivity type is formed next to a side wall of the trench insulating region on the source contact region side in the first diffusion region between the source contact region and the trench insulating region. A gate electrode is formed on the semiconductor substrate through a gate insulating film to cover an area from an end portion of the source contact region to at least a part of a top surface of the trench insulating region.

9 Claims, 8 Drawing Sheets

LDMOS DEVICE HAVING HOT CARRIER SUPPRESSION

RELATED APPLICATIONS

This application claims priority under 35 U.S.C. § 119 to Japanese Patent Application No. 2017-217346 filed on Nov. 10, 2017, the entire content of which is hereby incorporated by reference.

BACKGROUND OF THE INVENTION

1. Field of the Invention

The present invention relates to a semiconductor device, and more particularly, to a semiconductor device including an LDMOS.

2. Description of the Related Art

Shallow trench isolation (STI) is employed for element isolation in a microscopic process. STI is formed by the embedding of an insulating film in a trench formed in a substrate surface. The insulating film embedded in the trench is used not only for STI but also for the purpose of improving the withstand voltage of elements, and is employed in, for example, a semiconductor device illustrated in FIG. 10 which is an illustration of a semiconductor device including a laterally diffused metal oxide semiconductor (LDMOS) for a lateral high-withstand voltage MOS transistor (see FIG. 14 of Japanese Patent Application Laid-open No. 2014-107302, for example).

Figure 10:
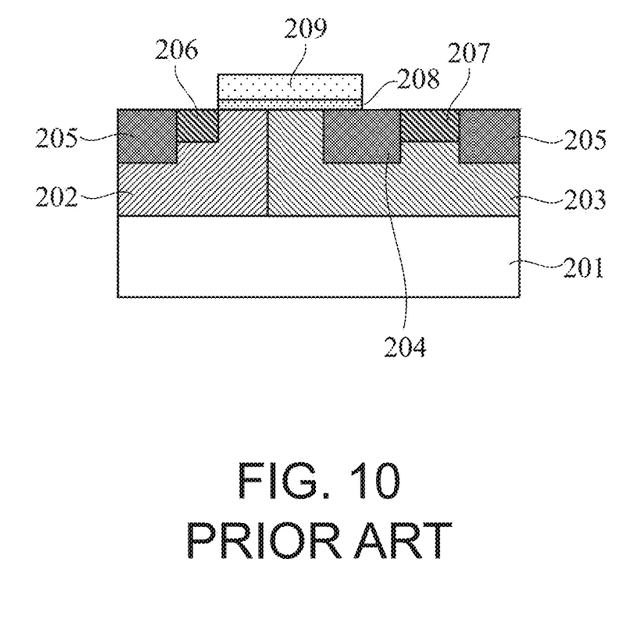
FIG. 10 is a sectional view for illustrating the configuration of the semiconductor device of the prior art.

The LDMOS in the semiconductor device of the prior art includes an n-type diffusion region 202 and a p-type diffusion region 203 which are formed next to each other in a semiconductor substrate 201, a p-type source contact region 206 which is formed in the n-type diffusion region 202, a p-type drain contact region 207 which is formed in the p-type diffusion region 203, a trench insulating region 204 which is formed next to the p-type drain contact region 207 in a portion of the p-type diffusion region 203 between the p-type source contact region 206 and the p-type drain contact region 207, and a gate electrode 209 which is formed above the semiconductor substrate 201 through a gate insulating film 208. The gate electrode 209 is formed so as to cover an area from an end portion of the p-type source contact region 206 on the p-type drain contact region 207 side to the top of the trench insulating region 204.

The LDMOS is isolated from other regions (not shown) by STI regions 205.

In the LDMOS of the prior art, the arrival of a depletion layer which is generated from a junction portion between the n-type diffusion region 202 and the p-type diffusion region 203, at a side wall of the trench insulating region 204 while the LDMOS is in operation increases the intensity of an electric field in the vicinity of the side wall, and the electric field increased in intensity accelerates carriers. Impact ionization consequently occurs in the vicinity of the side wall, and undesirably increases the possibility of hot carrier generation. While most of carriers (holes) including the generated hot carriers travel toward the drain contact region 207, some carriers are attracted to an electric potential applied to the gate electrode 209. An injection of the attracted carriers into the gate insulating film 208 leads to the breakdown of the gate insulating film 208.

On the other hand, a large number of defects due to a difference in thermal expansion coefficient between silicon serving as the substrate and the insulating film embedded in the trench, for example, a silicon oxide film, are found in the vicinity of side walls of the trench insulating region 204. The defects are present also in a portion of the gate insulating film 208 in the vicinity of side walls of the trench insulating region 204, and hence the portion of the gate insulating film 208 is vulnerable. The injection of some carriers described above readily occurs in the vulnerable portion of the gate insulating film 208, with the result that the gate insulating film 208 breaks down.

SUMMARY OF THE INVENTION

It is therefore an object of the present invention to provide a semiconductor device including an LDMOS capable of preventing the breakdown of a gate insulating film.

In one embodiment of the present invention, there is provided a semiconductor device including: a semiconductor substrate; a first diffusion region of a first conductivity type and a second diffusion region of a second conductivity type formed next to each other in the semiconductor substrate; a drain contact region of the first conductivity type formed in the first diffusion region; a source contact region of the first conductivity type formed in the second diffusion region; a trench insulating region formed in the first diffusion region between the drain contact region and the source contact region; a third diffusion region of the second conductivity type formed next to a side wall of the trench insulating region on the source contact region side in the first diffusion region between the source contact region and the trench insulating region; and a gate electrode formed on the semiconductor substrate through a gate insulating film so as to cover an area from an end portion of the source contact region on the drain contact region side to at least a part of a top surface of the trench insulating region.

According to the present invention, in which the third diffusion region opposite in polarity to the first diffusion region is provided next to the side wall of the trench insulating region, a depletion layer can be formed in advance in the first diffusion region. While the semiconductor device is in operation, the depletion layer formed in advance is joined by a depletion layer extending from a junction portion between the first diffusion region and the second diffusion region toward the drain contact region side. This enables the latter depletion layer to extend past the vicinity of the side wall of the trench insulating region to a neighborhood of the drain contact region. The intensity of an electric field in the vicinity of the side wall of the trench insulating region is thus lowered, and hence the acceleration of carriers in the vicinity of the side wall is reduced to a level lower than in the prior art and low enough to suppress the generation of hot carriers. The gate insulating film in the vicinity of the side wall of the trench insulating region is vulnerable as described above but, even when a few hot carriers are generated, the third diffusion region serving as an electric barrier against the hot carriers can prevent an injection of the hot carriers into the vulnerable portion found in the gate insulating film. The gate insulating film can thus be protected.

BRIEF DESCRIPTION OF THE DRAWINGS

Embodiments of the invention will now be described, by way of example, with reference to the accompanying drawings, in which.

DETAILED DESCRIPTION OF THE PREFERRED EMBODIMENTS

The invention will now be described herein with reference to illustrative embodiments.

Figure 1:
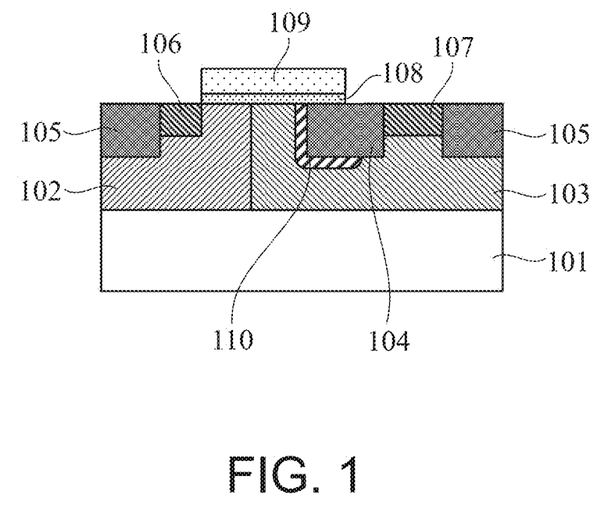
FIG. 1 is a sectional view for illustrating the structure of a semiconductor device according to a first embodiment of the present invention.

FIG. 1 is a sectional view for illustrating the structure of a semiconductor device according to a first embodiment of the present invention, in which an LDMOS is included. The description given below on the embodiments takes a p-channel LDMOS as an example.

As illustrated in FIG. 1, the LDMOS in the semiconductor device according to the first embodiment includes an n-type (a second conductivity type) diffusion region 102 and a p-type (a first conductivity type) diffusion region 103 which are formed next to each other in a semiconductor substrate 101 formed of p-type single-crystal silicon. A p-type source contact region 106 is formed in the n-type diffusion region 102, and a p-type drain contact region 107 is formed in the p-type diffusion region 103. The p-type diffusion region 103 has the same polarity as that of the p-type drain contact region 107, but is lower in impurity concentration than the p-type drain contact region 107.

A trench insulating region 104 is formed from, for example, a silicon oxide film in the p-type diffusion region 103 between the p-type source contact region 106 and the p-type drain contact region 107 so as to be in contact with the p-type drain contact region 107.

An n-type diffusion region 110 is formed in the p-type diffusion region 103 between the p-type source contact region 106 and the trench insulating region 104 so as to continuously cover the entirety of one side wall of the trench insulating region 104 and at least a part of a bottom surface of the trench insulating region 104 from an upper end portion of the trench insulating region 104.

A gate electrode 109 is formed on the semiconductor substrate 101 through a gate insulating film 108. The gate electrode 109 covers an area from an end portion of the p-type source contact region 106 on the p-type drain contact region 107 side to a part of a top surface of the trench insulating region 104 so that the p-type source contact region 106 is on one side of the gate electrode 109 while the p-type drain contact region 107 is on the other side of the gate electrode 109. The LDMOS in the semiconductor device according to the first embodiment is isolated from other regions (not shown) by STI regions 105 which are formed from, for example, silicon oxide films.

The operation of the thus configured semiconductor device according to the first embodiment is described next with reference to FIG. 2A to FIG. 2C.

The electric potential of the n-type diffusion region 110 is set to a floating potential when the semiconductor device according to the first embodiment is put into operation. To describe the operation state, a case is discussed in which a ground potential is applied to the p-type source contact region 106 (see FIG. 1), an electric potential (e.g., −2 V) lower than that of the p-type source contact region 106 is applied to the gate electrode 109, and an electric potential (e.g., −36 V) lower than that of the gate electrode 109 is applied to the p-type drain contact region 107 (see FIG. 1).

Figure 2A:
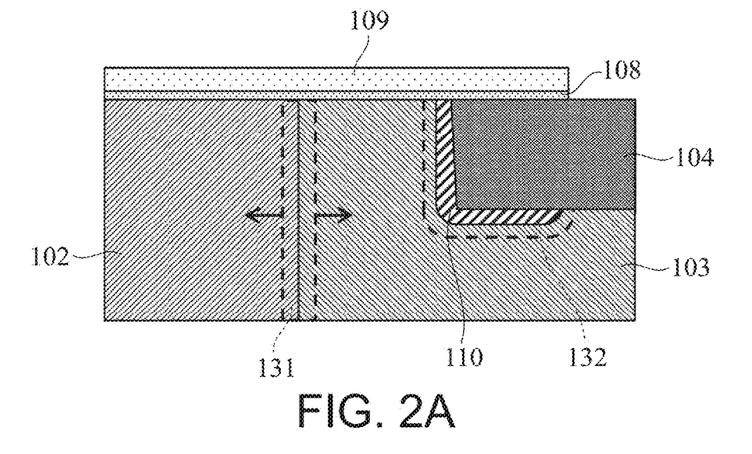
FIG. 2A, FIG. 2B, and FIG. 2C are sectional views for illustrating the states of depletion layers during the operation of the semiconductor device according to the first embodiment of the present invention.

When the electric potentials described above are applied to the gate electrode 109 and the p-type source contact region 106, and the electric potential of the p-type drain contact region 107 is decreased gradually from 0 V, a depletion layer 131 spreads as an electric potential difference between the n-type diffusion region 102 and the p-type diffusion region 103 changes as illustrated in FIG. 2A. The n-type diffusion region 110, on the other hand, differs in polarity from the p-type diffusion region 103, and a depletion layer 132 is accordingly formed in advance in a junction portion between the n-type diffusion region 110 and the p-type diffusion region 103.

Figure 2B:
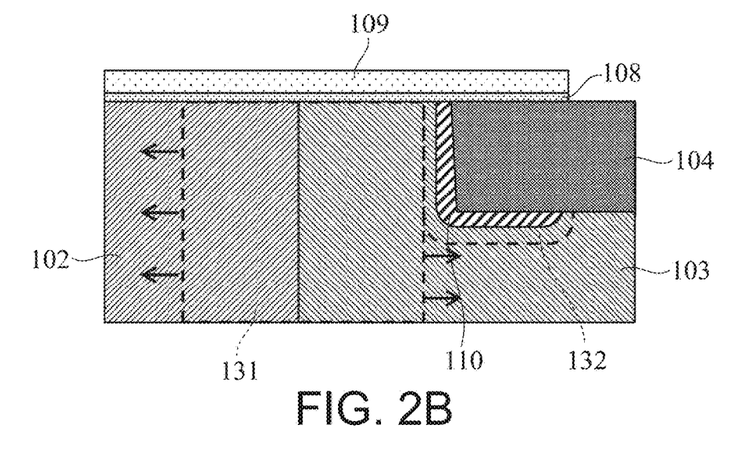

The electric potential of the p-type drain contact region 107 is decreased further until the depletion layer 131 reaches the depletion layer 132 and joins the depletion layer 132 as illustrated in FIG. 2B. The depletion layer 131 cannot extend further in the place where the depletion layer 131 joins the depletion layer 132, and accordingly extends downward below the depletion layer 132.

Figure 2C:
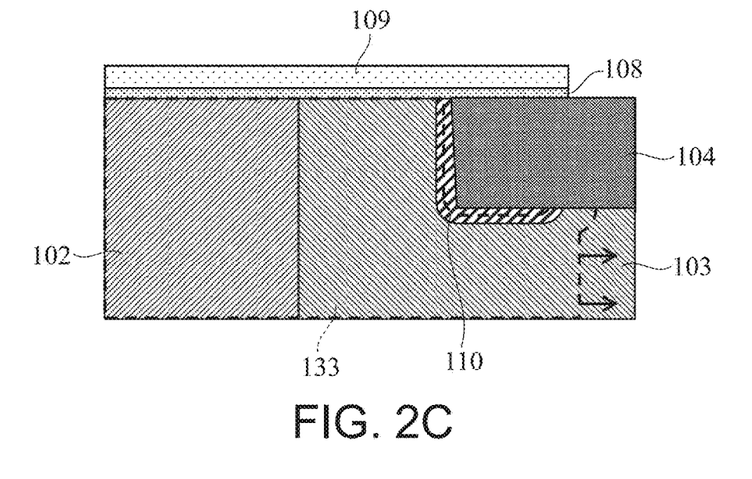

When the electric potential of the p-type drain contact region 107 is decreased further from the state of FIG. 2B, the depletion layer 131 and the depletion layer 132 extend further as one depletion layer 133 toward the p-type drain contact region 107 as illustrated in FIG. 2C.

As described above, the forming of the n-type diffusion region 110 allows the depletion layer 133 to extend past a side wall portion of the trench insulating region 104 on the p-type source contact region 106 side toward the p-type drain contact region 107 side. The intensity of an electric field in the vicinity of the side wall portion is accordingly lessened to reduce carrier acceleration, and the generation of hot carriers is suppressed as a result.

Figure 3A:
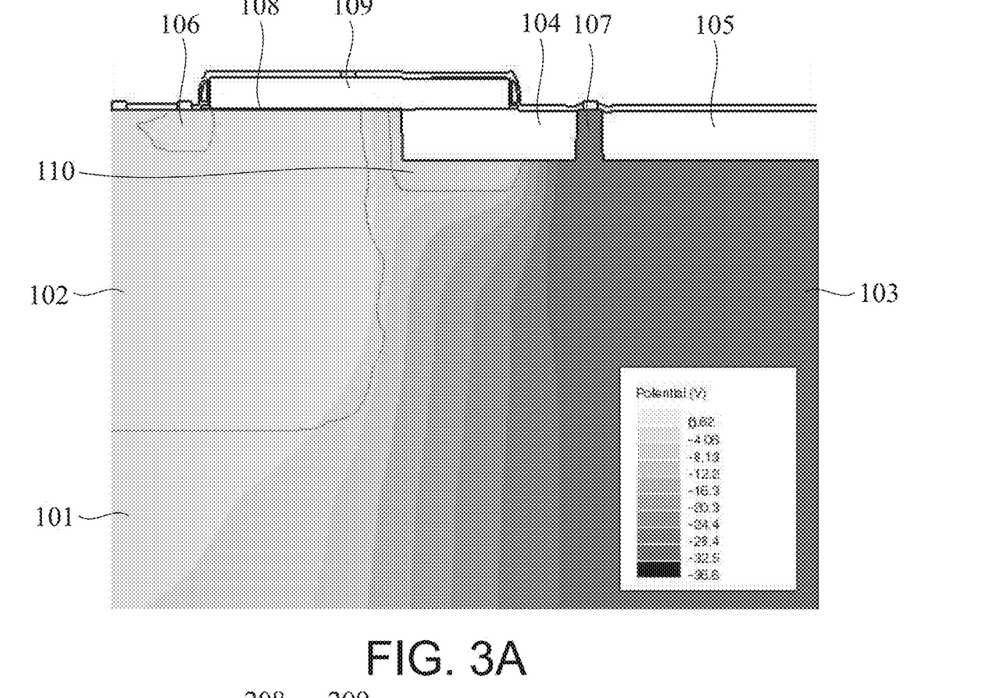
FIG. 3A and FIG. 3B are diagrams for illustrating the results of simulation for electric potential distribution in the semiconductor device according to the first embodiment of the present invention and a semiconductor device of the prior art while the semiconductor devices are in operation.
Figure 3B:
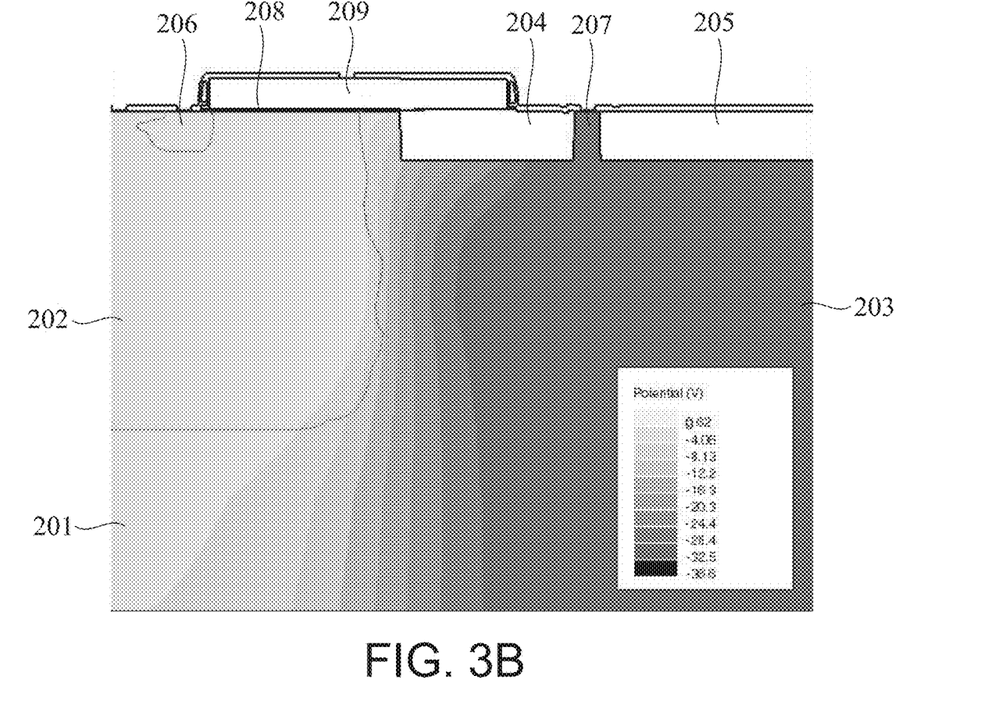

The effect of lessening the intensity of the electric field has been confirmed also by simulation. FIG. 3A is a diagram for illustrating the simulation result of electric potential distribution in the semiconductor device according to the first embodiment. FIG. 3B is a diagram for illustrating the simulation result of electric potential distribution in a semiconductor device of the prior art illustrated in FIG. 10, as a comparative example. As in the case described above, the ground potential is applied to the p-type source contact region 106, an electric potential of −2 V is applied to the gate electrode 109, and an electric potential of −36 V is applied to the p-type drain contact region 107.

It is confirmed from a comparison between the two that the electric potential change between the p-type source contact region 106 and the p-type drain contact region 107 occurs over a wider extent of area in the semiconductor device according to the first embodiment whose simulation result is illustrated in FIG. 3A than in the semiconductor device of the related art whose simulation result is illustrated in FIG. 3B. This indicates that the intensity of the electric field is successfully lessened by extending the depletion layer 133 (see FIG. 2C) toward the p-type drain contact region 107 side as described above.

According to the first embodiment, the generation of hot carriers can thus be suppressed in the vicinity of the side wall of the trench insulating region 104, and the breakdown of the gate insulating film 108 due to the hot carriers is consequently prevented.

The description given above deals with the suppression of hot carrier generation by the lessening of the intensity of the electric field between the p-type source contact region 106 and the p-type drain contact region 107. However, there is a case in which a few hot carriers are generated despite the lessening of electric field intensity described above. According to the first embodiment, the breakdown of the gate insulating film can be prevented in this case, too, in a manner described below.

Of the generated hot carriers, electrons travel toward the n-type diffusion region 102 which has the highest electric potential, and most holes travel toward the p-type drain contact region 107 which has a low electric potential. Some holes, however, travel toward the gate electrode 109 (the gate insulating film 108). In the first embodiment, in which the n-type diffusion region 110 is provided next to the side wall of the trench insulating region 104 on the p-type source contact region 106 side, the n-type diffusion region 110 has a high electric potential due to the diffusion potential of the p-n junction. The holes accordingly detour around the n-type diffusion region 110 on their way to the gate insulating film 108. This prevents the injection of holes (hot carriers) into a vulnerable portion in the gate insulating film 108 in the vicinity of the side wall of the trench insulating region 104 on the p-type source contact region 106 side. The breakdown of the gate insulating film 108 is consequently prevented.

According to the semiconductor device of the first embodiment, the effect of protecting the gate insulating film 108 is obtained by suppressing the generation of hot carriers through the forming of the n-type diffusion region 110 as described above.

While the description of the semiconductor device according to the first embodiment uses an example in which the ground potential is applied to the p-type source contact region 106, −2 V is applied to the gate electrode 109, and −36 V is applied to the p-type drain contact region 107, the condition about electric potentials to be applied is not limited to the example given above.

A method of manufacturing the semiconductor device of FIG. 1 is described next with reference to FIG. 4A and FIG. 4B and FIG. 5A to FIG. 5C.

Figure 4A:
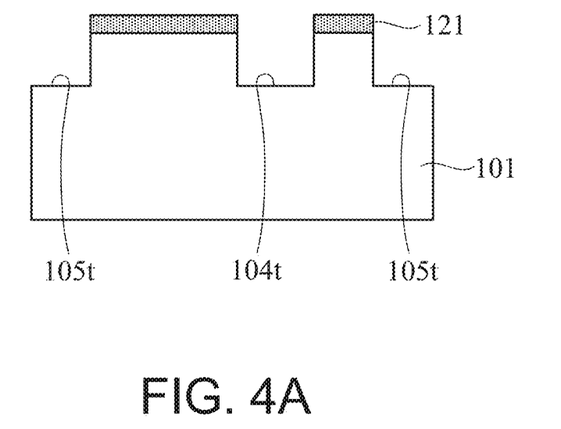
FIGS. 4A and 4B are sectional views for illustrating steps in a manufacturing process of the semiconductor device according to the first embodiment of the present invention.

A trench 104t for the trench insulating region and trenches 105t for STI are formed first in a surface of the semiconductor substrate 101 as illustrated in FIG. 4A. The trenches 104t and 105t are formed by forming a silicon nitride film 121 first over the entire surface of the semiconductor substrate 101, subsequently forming, through photolithography, a photoresist pattern (not shown) that has openings above regions in which the trenches 104t and 105t are to be formed, patterning the silicon nitride film 121 with the photoresist pattern as a mask, removing the photoresist pattern, and then etching the semiconductor substrate 101 with the patterned silicon nitride film 121 as a mask.

Figure 4B:
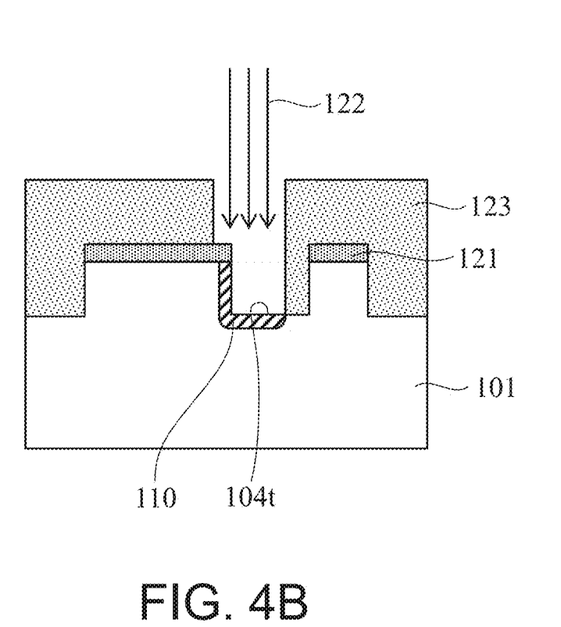

A photoresist pattern 123 is then formed so as to have an opening above a region next to the side surface of the trench 104t on the side of the p-type source contact region 106 (see FIG. 1) formed in a later step, and above at least a part of a region of the trench 104t that is continuous from the former region as illustrated in FIG. 4B. With the photoresist pattern 123 as a mask, an n-type impurity is implanted in the semiconductor substrate 101 by ion implantation as indicated by arrows 122. The n-type diffusion region 110 which continuously covers the side surface of the trench 104t and at least a part of the bottom surface of the trench 104t in the semiconductor substrate 101 is formed in this manner. The photoresist pattern 123 is then removed by ashing treatment or other methods.

Figure 5A:
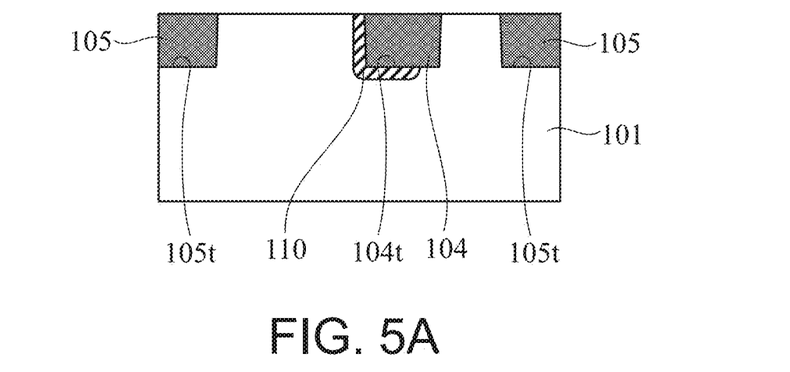
FIG. 5A, FIGS. 5B, and 5C are sectional views for illustrating steps in a manufacturing process of the semiconductor device according to the first embodiment of the present invention.

Next, a silicon oxide film, for example, is formed by chemical vapor deposition (CVD) as an insulating film embedded in the trenches 104t and 105t and deposited on the semiconductor substrate 101. The silicon nitride film 121 (see FIG. 4A and FIG. 4B) is then used as a stopper to remove the silicon oxide film on the semiconductor substrate 101 by chemical mechanical polishing (CMP) for leveling. The silicon nitride film 121 is then removed, thereby forming the trench insulating region 104 which is embedded in the trench 104t, and the STI regions 105 which are embedded in the trenches 105t, as illustrated in FIG. 5A.

Figure 5B:
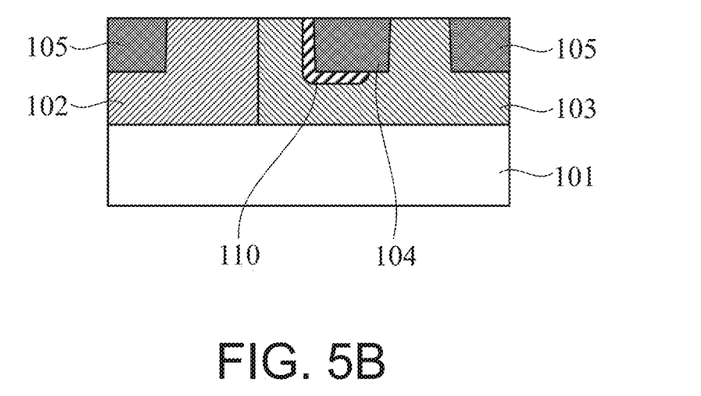

A photoresist pattern (not shown) is subsequently formed so as to have an opening above a region in which the n-type diffusion region 102 is formed as illustrated in FIG. 5B, and ion implantation of an n-type impurity is conducted. After the photoresist pattern is removed, another photoresist pattern (not shown) is formed so as to have an opening above a region in which the p-type diffusion region 103 is formed, and ion implantation of a p-type impurity is conducted. Heat treatment is then performed to form the n-type diffusion region 102 and the p-type diffusion region 103 next to each other in the semiconductor substrate 101.

Figure 5C:
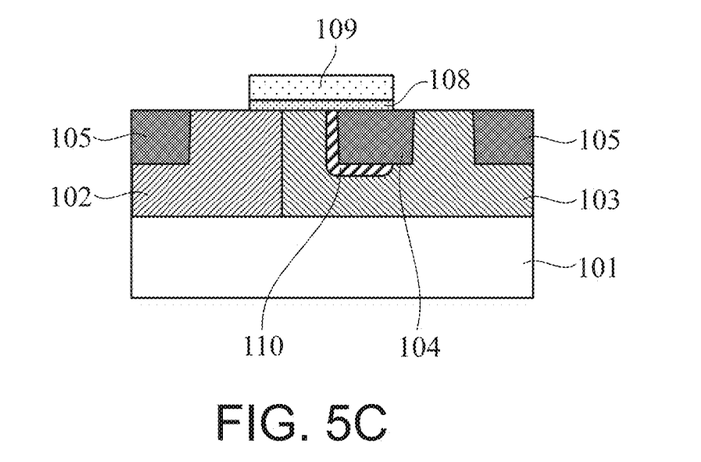

Next, the gate insulating film 108 is formed by thermally oxidizing the surface of the semiconductor substrate 101, and a polysilicon film, for example, is deposited on the gate insulating film 108 as a material of the gate electrode as illustrated in FIG. 5C. A photoresist pattern (not shown) is then formed so as to have an opening above a region in which the gate electrode is formed, and etching is conducted with the photoresist pattern as a mask. The gate electrode 109 and gate insulating film 108 patterned into desired shapes are formed in this manner.

Lastly, a p-type impurity is implanted by ion implantation in the entire surface, thereby forming the p-type source contact region 106 and the p-type drain contact region 107 through self-alignment. The semiconductor device according to the first embodiment illustrated in FIG. 1 is obtained through the steps described above.

Figure 6:
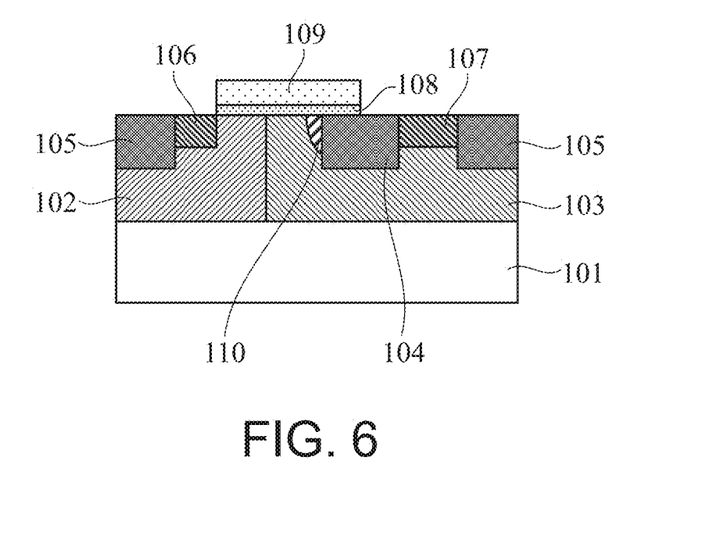
FIG. 6 is a sectional view for illustrating steps in a manufacturing process of the semiconductor device according to a second embodiment of the present invention.

FIG. 6 is a sectional view for illustrating the structure of a semiconductor device according to a second embodiment of the present invention.

The semiconductor device according to the second embodiment differs from that of the first embodiment in the extent of an area in which the n-type diffusion region 110 is formed. The n-type diffusion region 110 in the second embodiment is formed so as to cover at least a part of one side wall of the trench insulating region 104 including an upper end portion of the side wall.

The n-type diffusion region 110 that is formed in this manner, too, yields the effect of suppressing the generation of hot carriers. Even when a few hot carriers are generated, the effect of preventing an injection of the hot carriers (holes) into the vulnerable portion of the gate insulating film 108 is obtained since the electric potential of the n-type diffusion region 110 is high due to the diffusion potential of the p-n junction. The breakdown of the gate insulating film 108 is consequently prevented.

The semiconductor device according to the first embodiment is somewhat superior to the semiconductor device according to the second embodiment in terms of the effect of suppressing hot carriers. The LDMOS in the semiconductor device according to the second embodiment, however, has an advantage of being low in ON resistance. The reason is described below.

Heat treatment is conducted to form the n-type diffusion region 110 and the p-type diffusion region 103. In the heat treatment, the impurity of the n-type diffusion region 110 and the impurity of the p-type diffusion region 103 are both diffused, thereby raising the resistance of the p-type diffusion region 103. The semiconductor device according to the first embodiment is wide in the extent of an area in which the n-type diffusion region 110 is formed, and is affected by the rise in resistance quite easily. The semiconductor device according to the second embodiment, on the other hand, is hardly affected by the rise in resistance, and the ON resistance of the LDMOS can accordingly be made lower than that in the semiconductor device according to the first embodiment.

Figure 7:
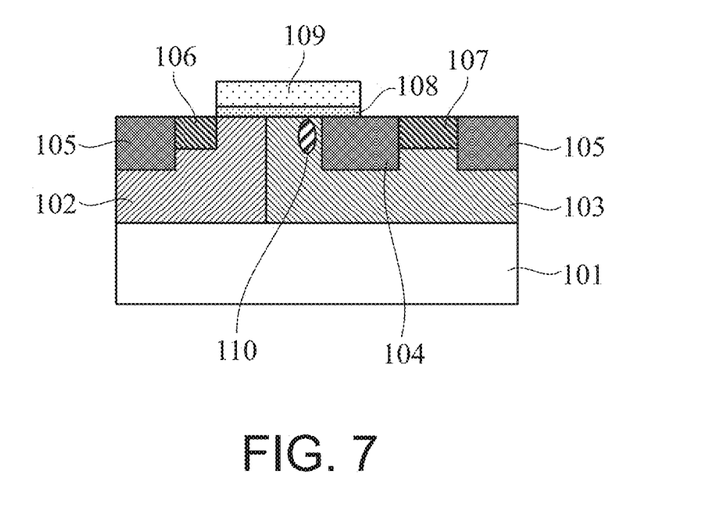
FIG. 7 is a sectional view for illustrating steps in a manufacturing process of the semiconductor device according to a third embodiment of the present invention.

FIG. 7 is a sectional view for illustrating the structure of a semiconductor device according to a third embodiment of the present invention.

The semiconductor device according to the third embodiment differs from those of the first embodiment and the second embodiment in the extent of an area in which the n-type diffusion region 110 is formed. The n-type diffusion region 110 in the third embodiment is formed in a place apart from a side wall portion of the trench insulating region 104. In other words, a part of the p-type diffusion region 103 is interposed between the n-type diffusion region 110 and a side wall of the trench insulating region 104.

The n-type diffusion region 110 that is formed in this manner, too, yields the effect of suppressing the generation of hot carriers. Although the n-type diffusion region 110 is spaced apart from the side wall portion of the trench insulating region 104, the electric potential of the n-type diffusion region 110 is high due to the diffusion potential, and the electric potential is high around the n-type diffusion region 110 as well. Accordingly, even when a few hot carriers are generated, hot carriers (holes) do not enter a region between the side wall of the trench insulating region 104 and the n-type diffusion region 110. The breakdown of the gate insulating film 108 due to an injection of hot carriers into a vulnerable portion of the gate insulating film 108 is consequently prevented in the third embodiment as well.

The effect of suppressing hot carrier generation can be obtained by forming the n-type diffusion region 110 in the vicinity of a side wall of the trench insulating region 104 as described above. The n-type diffusion region 110 therefore is not always required to cover the side wall portion of the trench insulating region 104 completely. However, the above-mentioned effect decreases when the n-type diffusion region 110 is too far from the side wall portion of the trench insulating region 104, and hence it is desirable to suitably adjust the extent of an area in which the n-type diffusion region 110 is formed.

The n-type diffusion region 110 in the second embodiment illustrated in FIG. 6 and the n-type diffusion region 110 in the third embodiment illustrated in FIG. 7 can be formed by suitably adjusting the position and size of the opening in the photoresist 123, or suitably adjusting the energy of ion implantation in the process step shown by FIG. 4B which is a diagram for illustrating the process of forming the n-type diffusion region 110 in the first embodiment.

Figure 8:
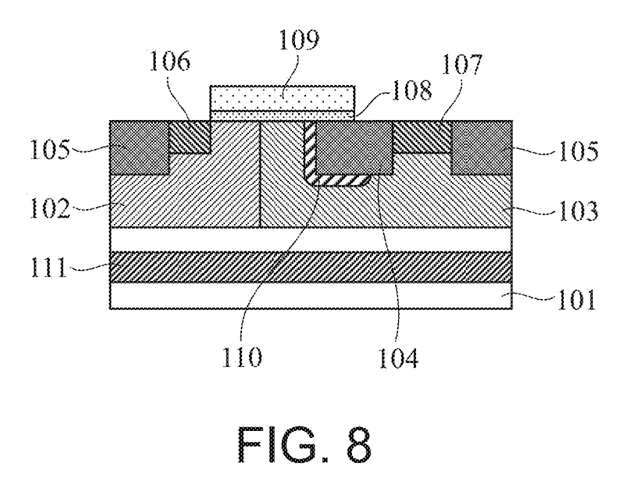
FIG. 8 is a sectional view for illustrating steps in a manufacturing process of the semiconductor device according to a fourth embodiment of the present invention.

FIG. 8 is a sectional view for illustrating the structure of a semiconductor device according to a fourth embodiment of the present invention.

The semiconductor device according to the fourth embodiment differs from that of the first embodiment in that an n-type embedded layer 111 is formed below the n-type diffusion region 102 and the p-type diffusion region 103 in the semiconductor substrate 101 and spaced from the n-type diffusion region 102 and the p-type diffusion region 103. The n-type embedded layer 111 is formed by, for example, implanting an n-type impurity by ion implantation at high energy before the trench insulating region 104 is formed.

The n-type embedded layer 111 is electrically connected to the n-type diffusion region 102. The p-type semiconductor substrate 101 and the LDMOS can electrically be isolated from each other in this manner.

A depletion layer due to a p-n junction is formed between the n-type embedded layer 111 and the p-type diffusion region 103. As described in the example of the first embodiment, a reverse-biased relation is formed between the n-type embedded layer 111 and the p-type diffusion region 103 when the electric potential of the p-type drain contact region 107 is lowered, and the depletion layer consequently spreads between the two. With this depletion layer formed between the n-type embedded layer 111 and the p-type diffusion region 103, the depletion layer 133 (see FIG. 2C) does not reach a deep portion of the p-type semiconductor substrate 101, and extends even further toward the p-type drain contact region 107 side. This means that, according to the fourth embodiment, the effect of lessening electric field intensity is expected to be even greater.

Figure 9:
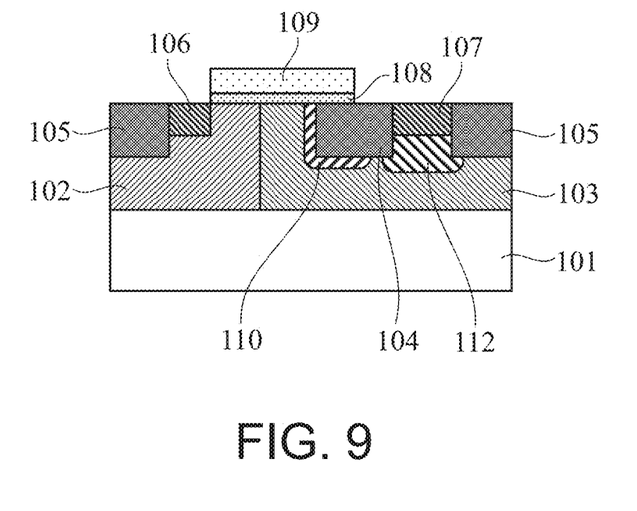
FIG. 9 is a sectional view for illustrating steps in a manufacturing process of the semiconductor device according to a fifth embodiment of the present invention.

FIG. 9 is a sectional view for illustrating the structure of a semiconductor device according to a fifth embodiment of the present invention.

The semiconductor device according to the fifth embodiment differs from that of the first embodiment in that a p-type diffusion region 112 which has an impurity concentration higher than that of the p-type diffusion region 103 and lower than that of the p-type drain contact region 107, is formed below the p-type drain contact region 107. The p-type diffusion region 112 is formed by implanting a p-type impurity by ion implantation at energy higher than the energy used to form the p-type drain contact region 107, after the p-type diffusion region 103 is formed.

The p-type diffusion region 112 in the fifth embodiment is higher in impurity concentration than the p-type diffusion region 103 as described above. This makes it difficult for a depletion layer to spread into the p-type diffusion region 112, thereby providing an effect of preventing the p-type drain contact region 107 from turning into a depleted region. An improvement in the withstand voltage of the semiconductor device can accordingly be expected.

However, the p-type diffusion region 112 has a possibility of causing avalanche breakdown because of its high impurity concentration. It is therefore desirable to suitably adjust the impurity concentrations of the n-type diffusion region 110 and the p-type diffusion region 112, and the extent of areas in which the n-type diffusion region 110 and the p-type diffusion region 112 are formed.

It is apparent that the present invention is not limited to the above embodiments, but may be modified and changed without departing from the scope and spirit of the invention.

For instance, while an example of employing a p-type semiconductor substrate as the semiconductor substrate is used in the embodiments described above, an n-type semiconductor substrate may be employed and the conductivity type of the semiconductor substrate is not limited. The present invention is also applicable to an n-channel LDMOS other than the p-channel LDMOS described above as an example.

The fourth embodiment and the fifth embodiment deal with an example in which the n-type embedded region 111 is added to the semiconductor device according to the first embodiment illustrated in FIG. 1, and an example in which the p-type diffusion region 112 is added to the semiconductor device of FIG. 1, respectively. The n-type embedded layer 111 and the p-type diffusion region 112 can be added to the semiconductor device according to the second embodiment and the semiconductor device according to the third embodiment as well. The semiconductor devices may also have a configuration in which the n-type embedded layer 111 and the p-type diffusion region 112 are both included.

What is claimed is:

1. A semiconductor device, comprising:
a semiconductor substrate;
a first diffusion region of a first conductivity type and a second diffusion region of a second conductivity type in contact with each other in the semiconductor substrate;
a drain contact region of the first conductivity type in the first diffusion region;
a source contact region of the first conductivity type in the second diffusion region;
a trench insulating region in the first diffusion region between the drain contact region and the source contact region;
a third diffusion region of the second conductivity type extending along a side wall of the trench insulating region on a source contact region side in the first diffusion region between the source contact region and the trench insulating region; and
a gate electrode overlying a gate insulating film on the semiconductor substrate, the gate electrode covering an area from an end portion of the source contact region to at least a part of a top surface of the trench insulating region,
wherein the third diffusion region continuously covers an entirety of the side wall of the trench insulating region on the source contact region side and at least a part of a bottom surface of the trench insulating region.

2. The semiconductor device according to claim 1, further comprising an embedded layer of the second conductivity type below the first diffusion region and the second diffusion region in the semiconductor substrate and spaced away from the first diffusion region and the second diffusion region.

3. The semiconductor device according to claim 1, further comprising a fourth diffusion region of the first conductivity type below and in contact with the drain contact region and extending below the trench isolation region and having an impurity concentration higher than an impurity concentration of the first diffusion region and lower than an impurity concentration of the drain contact region.

4. A semiconductor device, comprising
a semiconductor substrate;
a first diffusion region of a first conductivity type and a second diffusion region of a second conductivity type in direct contact with each other in the semiconductor substrate;
a drain contact region of the first conductivity type in the first diffusion region;
a source contact region of the first conductivity type in the second diffusion region;
a trench insulating region in the first diffusion region between the drain contact region and the source contact region;
a third diffusion region of the second conductivity type contacting a side wall of the trench insulating region on a source contact region side in the first diffusion region between the source contact region and the trench insulating region; and
a gate electrode overlying a gate insulating film on the semiconductor substrate, the gate electrode covering an area from an end portion of the source contact region to at least a part of a top surface of the trench insulating region, and
further comprising an embedded layer of the second conductivity type below the first diffusion region and the second diffusion region in the semiconductor substrate and spaced away from the first diffusion region and the second diffusion region.

5. The semiconductor device according to claim 4, further comprising a fourth diffusion region of the first conductivity type below and in contact with the drain contact region and extending below the trench isolation region and having an impurity concentration higher than an impurity concentration of the first diffusion region and lower than an impurity concentration of the drain contact region.

6. The semiconductor device according to claim 4, wherein a part of the first diffusion region resides between the third diffusion region and the trench insulating region and separates the third diffusion region from the side wall of the trench insulating region.

7. The semiconductor device according to claim 6, further comprising a fourth diffusion region of the first conductivity type below and in contact with the drain contact region and extending below the trench isolation region and having an impurity concentration higher than an impurity concentration of the first diffusion region and lower than an impurity concentration of the drain contact region.

8. A semiconductor device, comprising:
a semiconductor substrate;
a first diffusion region of a first conductivity type and a second diffusion region of a second conductivity type in direct contact with each other in the semiconductor substrate;
a drain contact region of the first conductivity type in the first diffusion region;
a source contact region of the first conductivity type in the second diffusion region;
a trench insulating region in the first diffusion region between the drain contact region and the source contact region;
a third diffusion region of the second conductivity type contacting a side wall of the trench insulating region on a source contact region side in the first diffusion region between the source contact region and the trench insulating region; and
a gate electrode overlying a gate insulating film on the semiconductor substrate, the gate electrode covering an area from an end portion of the source contact region to at least a part of a top surface of the trench insulating region, wherein the third diffusion region covers at least a part of the side wall of the trench insulating region on the source contact region side including an upper end portion of the side wall of the trench insulating region, and further comprising an embedded layer of the second conductivity type below the first diffusion region and the second diffusion region in the semiconductor substrate and spaced away from the first diffusion region and the second diffusion region.

9. The semiconductor device according to claim 8, further comprising a fourth diffusion region of the first conductivity type below and in contact with the drain contact region and extending below the trench isolation region and having an impurity concentration higher than an impurity concentration of the first diffusion region and lower than an impurity concentration of the drain contact region.

* * * * *